(12) United States Patent
Houda et al.

(10) Patent No.: US 6,171,884 B1
(45) Date of Patent: Jan. 9, 2001

(54) METHOD OF MANUFACTURING A CHIP TYPE ELECTRONIC ELEMENT

(75) Inventors: Masuyoshi Houda, Toyama; Takahiro Matsumoto, Tonami, both of (JP)

(73) Assignee: Murata Manufacturing Co, Ltd (JP)

(*) Notice: Under 35 U.S.C. 154(b), the term of this patent shall be extended for 0 days.

(21) Appl. No.: 09/235,960

(22) Filed: Jan. 22, 1999

(30) Foreign Application Priority Data

Feb. 16, 1998 (JP) .................................................. 10-051338

(51) Int. Cl.$^7$ .................................................. H01L 21/00
(52) U.S. Cl. .................. 438/67; 438/51; 438/55; 438/458; 438/964; 148/DIG. 138; 310/365
(58) Field of Search .................. 438/50, 51, 52, 438/53, 55, 56, 64, 67, 455, 456, 458, 964; 148/DIG. 138; 29/25.35; 310/365, 366

(56) References Cited

U.S. PATENT DOCUMENTS

| | | | |
|---|---|---|---|
| 5,319,517 | * | 6/1994 | Nomura et al. . |
| 5,515,022 | * | 5/1996 | Tashiro et al. . |
| 5,532,542 | * | 7/1996 | Yoshida et al. ........................ 310/348 |
| 5,862,034 | * | 1/1999 | Sato et al. ............................. 257/295 |
| 5,866,196 | * | 2/1999 | Ueno et al. ............................. 427/79 |
| 6,046,529 | * | 4/2000 | Yoshida et al. ........................ 310/348 |

FOREIGN PATENT DOCUMENTS 8-236308 * 9/1996 (JP) .

\* cited by examiner

*Primary Examiner*—Kevin M. Picardat
(74) *Attorney, Agent, or Firm*—Keating & Bennett LLP

(57) ABSTRACT

A method of manufacturing a chip type electronic component includes the steps of forming a multilayer body including a major surface and a side surface by laminating a plurality of substrates and at least one internal electrode interposed between two of the substrates, forming a groove between the two substrates at the side surface of the multilayer body so as to expose an end of the at least one internal electrode, and making the side surface of the multilayer body rough by performing barrel polishing on the multilayer body, the barrel polishing being performed in a barrel pot in which water, media, an abrasive powder and the multilayer body are provided and forming an external electrode on the side surface of the multilayer body, the external electrode being connected to the end of the internal electrode exposed at the groove.

20 Claims, 3 Drawing Sheets

METHOD OF MANUFACTURING A CHIP TYPE ELECTRONIC ELEMENT

BACKGROUND OF THE INVENTION

1. Field of the Invention

The present invention relates to a method of manufacturing a chip type electronic component which includes a multilayer body formed by laminating a plurality of substrates and at least one internal electrode interposed between two of the substrates and an external electrode disposed on a side surface of the multilayer body and connected to the internal electrode.

2. Description of Related Art

A chip type electronic component described above is well known. Because the external electrode is connected to the internal electrode only at a small area, there is a risk that the internal and external electrodes are disconnected easily by variations in the substrate size, the position the internal electrode, and other factors.

One method of manufacturing a chip type electronic component to overcome the above problem is disclosed in Japanese Patent Publication No. 7-120913. The method includes the steps of forming a groove at a side surface of a multilayer body so as to expose an end of an internal electrode and forming an external electrode on the side surface of the multilayer body. The groove at the side surface of the multilayer body is formed via cutting using a cutting machine or via sand-blasting.

However, when the groove is formed at the side surface of the multilayer body via cutting using a cutting machine, because each chip component needs to be positioned and maintained accurately, the grooves in each chip component cannot be made efficiently and the process of manufacturing many chip components cannot be performed effectively. Moreover, it is difficult to utilize the cutting process using a cutting machine for forming the groove for microchip components because of the relatively small size of such components.

When sand-blasting is utilized for forming the groove at the side surface of the multilayer body, there is an advantage in that the side surface of the multilayer body can be roughened and thereby, the contact strength between the multilayer body and the external electrode improves.

However, it is difficult to form the groove having a depth such that the end of the internal electrode is exposed reliably when forming the groove via sandblasting. Moreover, the chip type electric components must be aligned with a pallet or a jig and the sand-blasting needs to be performed on all the respective side surfaces of the multilayer bodies where the respective internal electrodes are desired to be exposed. Therefore, the pallet and the jig prepared in accordance with each of the different size electric components are required, causing increased cost. Further, when the manufacturing processing step is required to be performed four times (i.e. sandblasting each side surface of the chip component), the processes for re-positioning and aligning the chip type electric components via a pallet or a jig are required to be performed three times.

Furthermore, in both of the above two processes (cutting and sand-blasting), only one side surface of the multilayer body can be processed at one time. When an external electrode is continuously formed at the side surface of the multilayer body and a surface adjacent to the side surface, since a sharp edge is formed at the boundary of these two surfaces, the film thickness of the external electrode can not be maintained and therefore, a disconnection between different portions of the external electrode easily occurs at the sharp edge causing a component to be defective.

SUMMARY OF THE INVENTION

To overcome the problems described above, preferred embodiments of the present invention provide a method of manufacturing a chip type electric component in which a groove at a side surface of a multilayer body where an end of an internal electrode is exposed is formed effectively and inexpensively, and at the same time the side surface of the multilayer body is roughened and an edge portion of the multilayer body is formed to have a gradually curved shape.

According to one preferred embodiment of the present invention, a method of manufacturing a chip type electronic component includes the steps of forming a multilayer body including a major surface and a side surface by laminating a plurality of substrates and at least one internal electrode interposed between two of the substrates, forming a groove between the two substrates at the side surface of the multilayer body so as to expose an end of the at least one internal electrode, and making the side surface of the multilayer body rough by performing barrel polishing on the multilayer body, the barrel polishing being performed in a barrel pot in which water, media, an abrasive powder and the multilayer body are provided, and forming an external electrode on the side surface of the multilayer body, the external electrode being connected to the end of the at least one internal electrode exposed at the groove.

According to the above described method, because the barrel polishing is performed in a barrel pot in which water, the media, the abrasive powder and the multilayer body are provided, an unexpected synergistic effect is achieved. More specifically, a roughening effect of the abrasive powder and an effect of making an edge portion of the multilayer body curved and a cushion effect provided by the media, is obtained. As a result, the side surface of the multilayer body can be made sufficiently rough, and a groove having a curved portion and in which the end of the internal electrode is exposed can be formed easily and inexpensively.

Therefore, a sufficient contact strength between the side surface of the multilayer body and the external electrode is obtained when the external electrode is formed on the side surface of the multilayer body. Also, the internal electrode can be connected to the external electrode along a large area, and therefore, the reliability of the connection increases.

Moreover, when the barrel polishing is performed, an effect of making an edge portion of the multilayer body curved is also effective at the edge portion between the side surface and the surface adjacent to the side surface of the multilayer body. As a result, the edge portion has a gradually curved shape. When the external electrode is formed over the side surface and the adjacent surface of the multilayer body, the disconnection of the external electrode at the edge portion is prevented because the edge portion has the gradually curved shape.

If barrel polishing is performed on the multilayer body on which a thick-film electrode is formed, with water, media, and an abrasive powder as described above, the damage to the thick film is so low that it is negligible. In other words, a damage to the section which occupies a large area is extremely low. Therefore, an electrode does not need to be formed again on the multilayer body where the thick-film electrode was preformed, and consequently, productivity is high.

Further, barrel polishing of many multilayer bodies can be performed at the same time. Moreover, because there is no need to position each multilayer body and to change the electric element aligned with a pallet or a jig, productivity improves markedly compared with the above described cutting method or sand-blasting method.

In the above described method, the media inserted in the barrel pot has preferably more volume than the multilayer body, and the diameter of media is preferably less than about two times a length of the longest edge of the multilayer body. As a result, the effect of making an edge portion of the multilayer body curved is particularly effective, and defects such as splitting or chipping of the electrodes are prevented.

When preferred embodiments of the present invention are applied to a piezoelectric component, the external electrode is preferably formed by a thin-film forming method. If the external electrode is formed by a thick-film forming method, there is a possibility that a dipole may be generated in the case of a piezoelectric component. It should be noted that a contact strength between the external electrode and the multilayer body becomes lower compared to the thick-film forming method, because heat processing is not performed in the thin-film forming method. In preferred embodiments of the present invention, a sufficient contact strength is obtained by roughening the side surface of the multilayer body.

Other features and advantages of the present invention will become apparent from the following description of preferred embodiments of the invention which refers to the accompanying drawings.

DETAILED DESCRIPTION OF PREFERRED EMBODIMENTS

Figure 1:
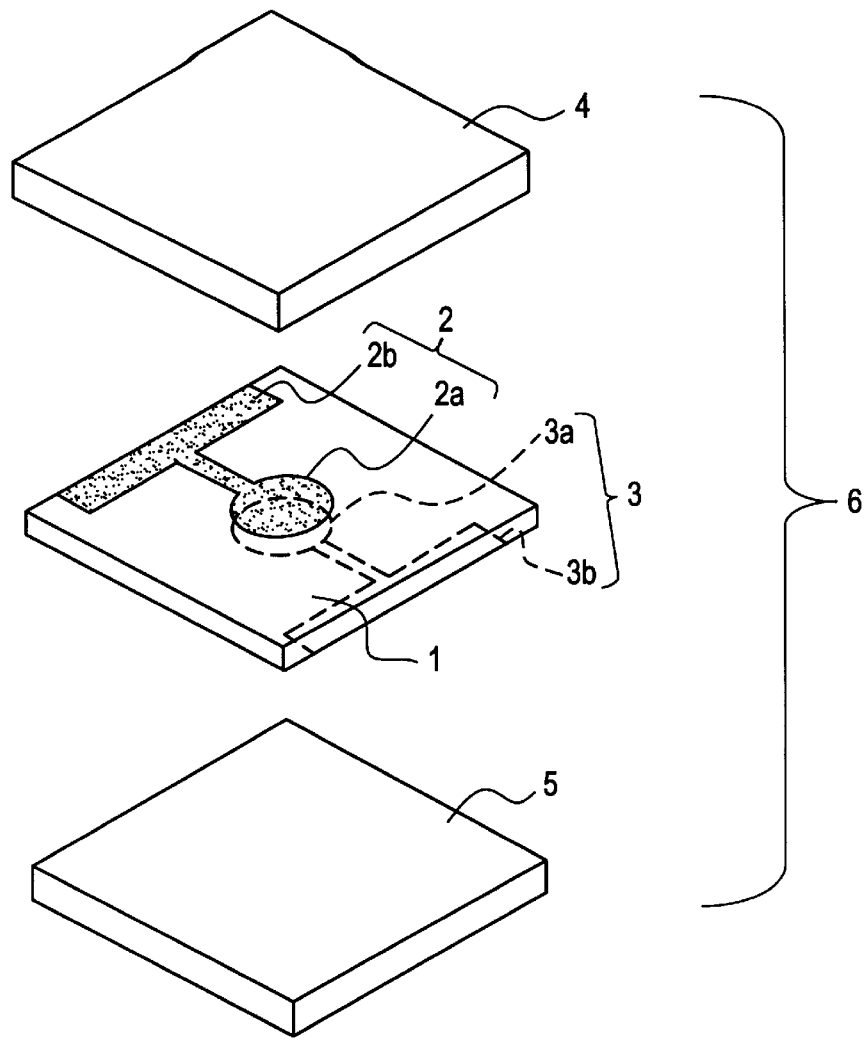
FIG. 1 is an exploded perspective view showing an example of a chip type electronic component relating to preferred embodiments of the present invention.
Figure 2:
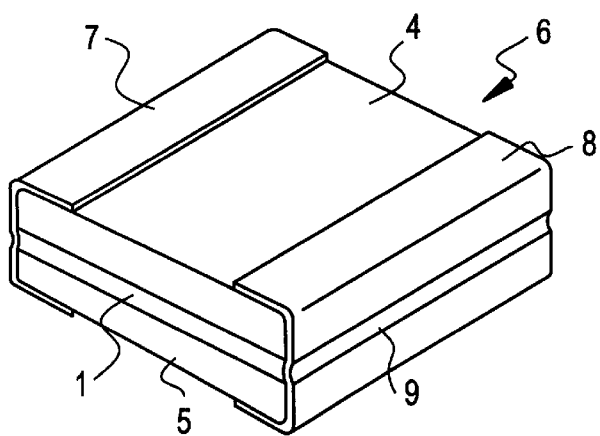
FIG. 2 is a perspective view showing the electronic component of FIG. 1.
Figure 3:
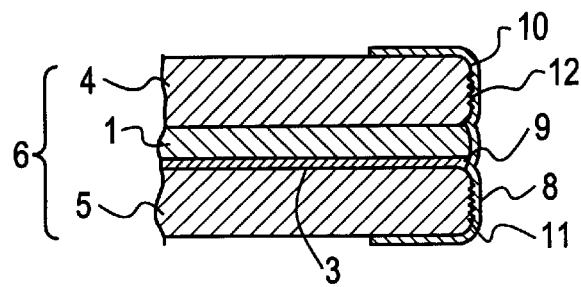
FIG. 3 is a partial expanded sectional view of the electronic component of FIG. 2.

FIGS. 1–3 show a ceramic oscillator which is an example of a chip type electronic component relating to preferred embodiments of the present invention.

FIG. 1 shows a state of the oscillator before laminating substrates and an internal electrode interposed between the substrates. A substrate 1 is a piezoelectric substrate made of PZT, for example. The internal electrodes 2 and 3 are respectively formed on the upper and lower surfaces of the substrate 1. The internal electrode 2 disposed on the upper surface of the substrate 1 includes an oscillation electrode 2a disposed at the approximate center portion of the substrate 1 and the lead-out-electrode 2b which extends out to one side edge of the substrate 1. The internal electrode 3 disposed on the lower surface of the substrate 1 includes an oscillation electrode 3a opposed to the oscillation electrode 2a via the substrate 1 and a lead-out-electrode 3b which extends out to another side edge of the substrate 1. When a voltage is applied between the oscillation electrodes 2a and 3a, thickness extensional vibration is excited in the substrate 1. It should be noted that, in the ceramic oscillator, other vibration modes such as thickness shear vibration, for example, may be utilized.

The sealing substrates 4 and 5, which are preferably made from materials harder than the piezoelectric substrate 1, such as alumina, are laminated on the upper and lower surfaces of the piezoelectric substrate 1, and a multilayer body 6 is formed. When the lamination is performed, a predetermined space for allowing for unhindered vibration of the oscillation electrodes 2a and 3a is formed around the electrodes 2a, 3a. To provide the space, a recess may be formed on the sealing substrates 4 and 5. Alternatively, such a space can be provided by a certain thickness of an adhesive agent disposed between the piezoelectric substrate 1 and the sealing substrates 4 and 5 for bonding the substrates 1, 4 and 5.

FIG. 2 shows the ceramic oscillator of a finished product. In the ceramic oscillator, external electrodes 7 and 8 are continuously formed on the side surface where the lead-out electrodes 2b and 3b of the multilayer body 6 are exposed, and the upper and lower surfaces adjacent to the side surface. The internal electrodes 2 and 3 and the external electrodes 7 and 8 are electrically connected. These external electrodes 7 and 8 are preferably formed by well-known thin-film forming methods, such as sputtering or deposition.

As shown in FIG. 3, at the side surface where the lead-out electrodes 2b and 3b of the multilayer body 6 are exposed, a groove 9 is formed at a boundary portion of the piezoelectric substrate 1 and the sealing substrates 4 and 5. Also, curved surfaces 10 and 11 are formed at the edge portion of the sealing substrates 4 and 5. As a result, the groove 9 has a gradual curved shape rather than a sharp shape. The end of the internal electrodes 2 and 3 are exposed at the bottom of the groove 9.

Furthermore, a rough surface 12 which has a microroughness is provided on the side surface of the multilayer body 6. Therefore, by forming the external electrodes 7 and 8 on the rough surface 12, the contact strength between the side surface of the multilayer body 6 and the external electrodes 7 and 8 is significantly increased and becomes very large. The internal electrodes 2 and 3 are reliably connected to the external electrodes 7 and 8 because the external electrodes 7 and 8 extend into the groove 9.

Furthermore, at the portions 10 and 11 located between the side surface of the multilayer body 6 and the upper and lower surfaces, the film thickness of each of external electrodes 7 and 8 is maintained because the portions 10 and 11 are curved. Therefore, disconnection of the electrodes at the curved portions 10 and 11 is prevented, and thereby, a reliable ceramic oscillator is obtained.

Hereinafter, the method of roughening the side surface of the multilayer body 6 to form the groove 9 and the curved portions 10 and 11 is explained.

Figure 4:
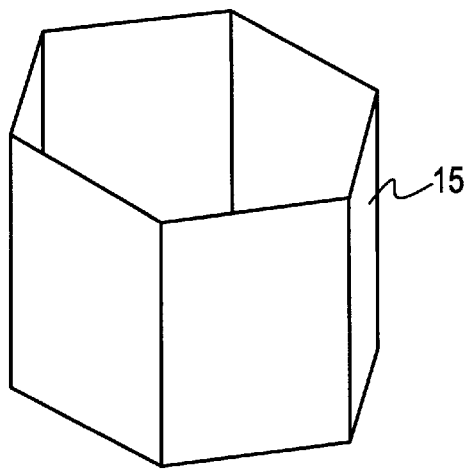
FIG. 4 is a perspective view of a barrel pot utilized in preferred embodiments of the present invention.

FIG. 4 shows a barrel pot 15. In this preferred embodiment, the barrel pot 15 is preferably a hexagon-head tube type. However, the shape of the barrel pot 15 is arbitrary and can be any of a variety of shapes.

In the barrel pot 15, water, the multilayer body 6, media, and an abrasive powder are inserted.

Next, the barrel pot 15 was rotated for 5–10 minutes to thereby perform barrel polishing.

The multilayer body 6 used here as one example is a ceramic multilayer body having a length, width and thickness which are approximately 4.0 mm, 3.0 mm and 1.5 mm, respectively.

The media preferably has a diameter which is less than two times a length of the longest edge of multilayer body 6. It is also desirable to insert a volume of media which is more than the volume of the multilayer body 6. In this example, ceramic balls having a diameter of about 5 mm was used as the media.

As an abrasive powder, $SiO^2$ group and alumina group of #200–#500 are desirable. In this example, SiO group of #320 is used as the abrasive powder.

FIGS. 5A, 5B, 5C and 5D show resultant multilayer bodies produced using the above described barrel-polishing. To produce the multilayer bodies shown in FIGS. 5A, 5B, 5C and 5D, the volume ratios of water, the multilayer body, media, and abrasive powder are different from each other.

Figure 5A:
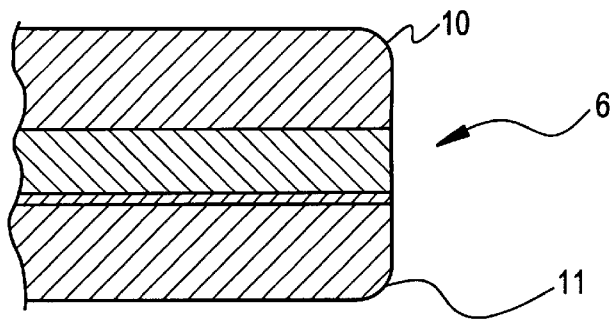
FIGS. 5A, 5B, 5C and 5D are sectional views showing each result of barrel polishing of the multilayer body with water, media, and the abrasive powder in the various volume ratios.
Figure 5B:
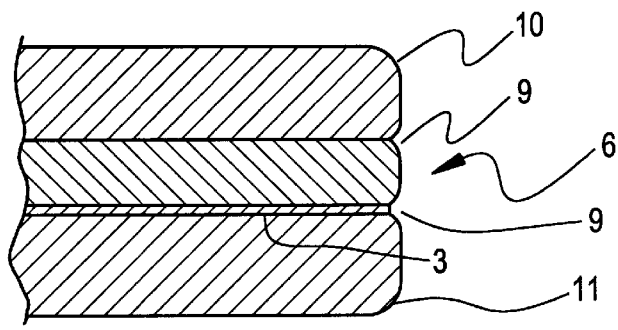
Figure 5C:
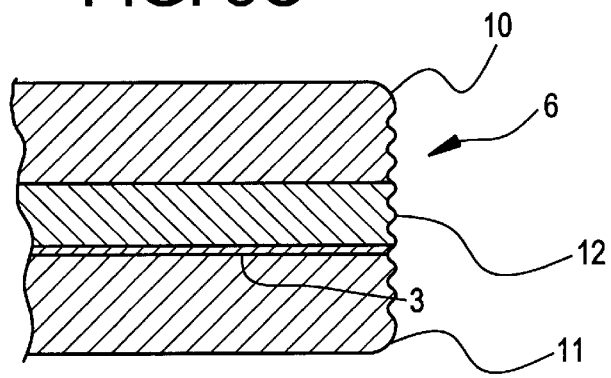
Figure 5D:
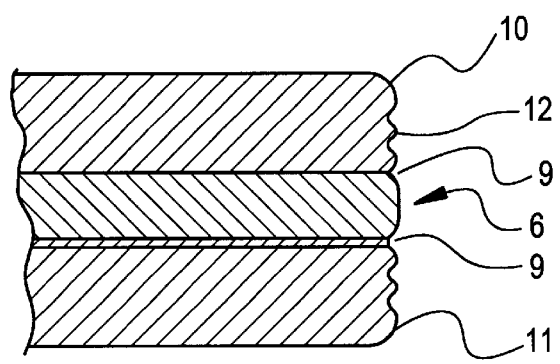

FIG. 5A shows an example in which water and the multilayer body 6 have a volume ratio of 1:0.2 and provided in the barrel pot 15. FIG. 5B shows an example in which water, the multilayer body 6 and media have a volume ratio of 1:0.2:0.5 and are provided in the barrel pot 15. FIG. 5C shows an example in which water, the multilayer body 6, and an abrasive powder have a volume ratio of 1:0.2:0.1 and are provided in the barrel pot 15. FIG. 5D shows an example (a preferred embodiment of the present invention) in which water, the multilayer body, media, and an abrasive powder have a volume ratio of 1:0.2:0.5:0.1 and are provided in the barrel pot 15.

In the example shown in FIG. 5A, only the curved portions 10 and 11 are provided. The side surface of the multilayer body is not roughened and a groove is not formed.

In the example shown in FIG. 5B, the curved portions 10 and 11 become large. However, the end of the internal electrodes 2 and 3 are only slightly exposed and roughening of the side surface of the multilayer body does not occur.

In the example shown in FIG. 5C, the curved portions 10 and 11 become fairly small and the side surface of the multilayer body is roughened completely. However, the end of the internal electrodes 2 and 3 are hardly exposed.

In the example of FIG. 5D (a preferred embodiment of the present invention), by a synergistic effect of the media and the abrasive powder, the curved portions 10 and 11, the side surface 12 of the multilayer body is roughened sufficiently and the groove 9 where the ends of the internal electrodes 2 and 3 are exposed. These effects are achieved simultaneously and therefore, excellent results are obtained.

Figure 6:
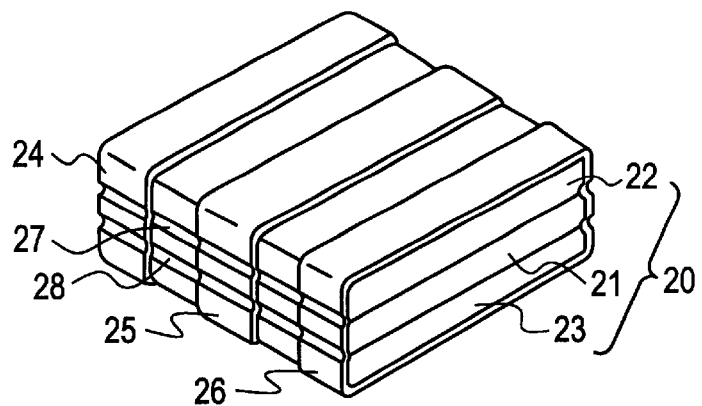
FIG. 6 is a perspective diagram of another example of a chip type electronic component having three terminals relating to preferred embodiments of the present invention.

Although the above-described preferred embodiments show the ceramic oscillator having two terminals, the present invention is also applicable for a ceramic oscillator having three terminals as shown in FIG. 6 (a load capacitance built-in type oscillator, ceramic filter for example) and other electric components such as a monolithic ceramic capacitor.

In FIG. 6, a multilayer body 20 includes a piezoelectric substrate 21 and sealing substrates 22 and 23. External electrodes 24–26 are provided on the multilayer body 20. The grooves 27 and 28 where ends of internal electrodes are exposed are formed between the piezoelectric substrate 21 and the sealing substrates 22 and 23 at the side surface of the multilayer body 20. The side surface of the multilayer body 30 is roughened.

While the invention has been particularly shown and described with reference to preferred embodiments thereof, it will be understood by those skilled in the art that the forgoing and other changes in form and details may be made therein without departing from the spirit of the invention.

What is claimed is:

1. A method of manufacturing an electronic component, comprising the steps of:

forming a multilayer body including a side surface by laminating a plurality of substrates and at least one internal electrode interposed between two of said substrates;

forming a groove between said two of said substrates at the side surface of said multilayer body so as to expose an end of said at least one internal electrode, and making the side surface of said multilayer body rough by performing barrel polishing on said multilayer body, said barrel polishing being performed in a barrel pot in which water, media, an abrasive powder and said multilayer body are provided; and forming an external electrode on the side surface of said multilayer body such that said external electrode is connected to the end of said internal electrode exposed at said groove.

2. The method according to claim 1, wherein said media inserted in said barrel pot has a volume that is greater than a volume of said multilayer body.

3. The method according to claim 1, wherein a diameter of said media is less than about two times a length of a longest edge of said multilayer body.

4. The method according to claim 1, wherein said external electrode is formed by a thin-film forming method.

5. The method according to claim 1, wherein said external electrode is formed by a thick-film forming method.

6. The method according to claim 1, wherein during said step of forming said groove, outer edge portions of the substrates located between the side surface of the multilayer body and upper and lower surfaces thereof are formed to have curved shapes, and the external electrode is formed on the curved shapes of the outer edge portions.

7. The method according to claim 1, wherein said external electrode extends into said groove.

8. The method according to claim 1, wherein said multilayer body comprises a ceramic oscillator.

9. The method according to claim 8, wherein said ceramic oscillator includes at least two terminals.

10. The method according to claim 8, wherein said ceramic oscillator includes at least three terminals.

11. The method according to claim 1, wherein said media comprises ceramic balls having a diameter of about 5 mm.

12. The method according to claim 1, wherein said abrasive powder includes at least one of an $SiO^2$ group material and alumina group material having a size of between #200 and #500.

13. The method according to claim 1, wherein said water, said multilayer body, said media, and said abrasive powder have a volume ratio of about 1:0.2:0.5:0.1.

14. A method of manufacturing an electronic component, comprising the steps of:

forming a multilayer body including a side surface by laminating a plurality of substrates and at least one internal electrode interposed between two of said substrates;

forming a groove between said two of said substrates at the side surface of said multilayer body so as to expose an end of said at least one internal electrode while simultaneously forming curved shapes at outer edge portions of the substrates located between the side surface of the multilayer body and upper and lower surfaces thereof, and making the side surface of said multilayer body rough; and forming an external electrode on the curved shapes of the side surface of said multilayer body such that said external electrode is connected to the end of said internal electrode exposed at said groove.

15. The method according to claim 14, wherein said step of forming a groove while simultaneously forming curved shapes and making the side surface rough includes the step of barrel polishing said multilayer body.

16. The method according to claim 15, wherein said barrel polishing is performed in a barrel pot in which water, media, an abrasive powder and said multilayer body are provided.

17. The method according to claim 15, wherein said media inserted in said barrel pot has a volume that is greater than a volume of said multilayer body.

18. The method according to claim 15, wherein a diameter of said media is less than about two times a length of a longest edge of said multilayer body.

19. The method according to claim 14, wherein said external electrode extends into said groove.

20. The method according to claim 14, wherein said multilayer body comprises a ceramic oscillator.

* * * * *